United States Patent
Kumar

(10) Patent No.: US 9,419,589 B2
(45) Date of Patent: Aug. 16, 2016

(54) POWER SOURCE FOR CLOCK DISTRIBUTION NETWORK

(71) Applicant: Apple Inc., Cupertino, CA (US)

(72) Inventor: Rohit Kumar, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 344 days.

(21) Appl. No.: 13/968,940

(22) Filed: Aug. 16, 2013

(65) Prior Publication Data

US 2015/0048873 A1    Feb. 19, 2015

(51) Int. Cl.
*H03K 3/012*  (2006.01)
*G06F 1/10*   (2006.01)

(52) U.S. Cl.
CPC . *H03K 3/012* (2013.01); *G06F 1/10* (2013.01)

(58) Field of Classification Search
CPC ............. H03K 3/012; G06F 1/10; G06F 1/26; G06F 1/04
See application file for complete search history.

(56) References Cited

U.S. PATENT DOCUMENTS

| | | | |
|---|---|---|---|
| 6,204,713 B1 | 3/2001 | Adams et al. | |
| 6,397,375 B1 | 5/2002 | Block et al. | |
| 6,611,920 B1 | 8/2003 | Fletcher et al. | |
| 6,867,632 B2 | 3/2005 | Nitta | |
| 7,610,504 B2 | 10/2009 | Oikawa | |
| 7,768,334 B2 * | 8/2010 | Yamane | G06F 1/10 327/297 |
| 7,847,408 B2 | 12/2010 | Masleid et al. | |
| 8,026,701 B2 | 9/2011 | Kim | |
| 2002/0167857 A1 | 11/2002 | Magoshi | |
| 2003/0037271 A1 * | 2/2003 | Liu | G06F 1/10 713/322 |
| 2003/0222695 A1 * | 12/2003 | Bosshart | G06F 1/10 327/295 |
| 2004/0145397 A1 * | 7/2004 | Lutkemeyer | G06F 1/10 327/158 |
| 2006/0170480 A1 * | 8/2006 | Chiu | G06F 1/32 327/297 |
| 2009/0128213 A1 * | 5/2009 | Rofougaran | G06F 1/06 327/295 |
| 2010/0164286 A1 * | 7/2010 | Okano | G06F 1/3203 307/43 |
| 2011/0304052 A1 * | 12/2011 | Turner | G06F 17/5077 257/773 |

OTHER PUBLICATIONS

International Search Report and Written Opinion from PCT/US2014/048426, issued Oct. 8, 2014, Apple Inc., pp. 1-12.
Office Action and Search Report in ROC (Taiwan) Application No. 103127345 issued Jan. 20, 2016.
International Preliminary Report on Patentability in application No. PCT/US2014/048426 issued Feb. 25, 2016.

* cited by examiner

*Primary Examiner* — Fahmida Rahman
(74) *Attorney, Agent, or Firm* — Meyertons, Hood, Kivlin, Kowert & Goetzel, P.C.; Erik A. Heter

(57) ABSTRACT

A clock distribution network having a separate power supply for top levels thereof is disclosed. In one embodiment, an integrated circuit includes a clock distribution network configured to distribute a clock signal to each of a number of clock consumers. The clock distribution network is arranged in a hierarchy of levels, with each of the levels including at least one buffer, and with the upper levels being closer to a source of the clock signal and the lower levels being closer to the clock consumers. The buffers of the upper levels are coupled to receive power from a first power source, via a first power grid. The buffers of the lower levels are coupled to receive power from a second power source, separate from the first, via a second power grid.

16 Claims, 7 Drawing Sheets

POWER SOURCE FOR CLOCK DISTRIBUTION NETWORK

BACKGROUND

1. Technical Field

This disclosure is directed to integrated circuits, and more particularly, to networks for distributing a clock signal in an integrated circuit.

2. Description of the Related Art

Modern digital integrated circuits use clock signals to synchronize the operation of sequential circuits implemented therein. A given clock signal may be provided to a number of circuits (e.g., flip-flops) within a corresponding clock domain. Since the number of circuits utilizing the clock signal may be large and relatively remote from the clock source, a clock distribution network (sometimes referred to as a 'clock tree') may be used to distribute the clock signal. A clock tree may include a number of levels, with buffers implemented at the various levels. At a node known as a root node of the clock tree, the clock signal may be received by a buffer from a clock source. The buffer may distribute the clock signal to additional buffers of the next level of the clock tree. At each level, an expanding number of buffers (with respect to a previous level) may distribute the clock signal. At the output of each buffer of a final level, the clock signal may be distributed to the various circuits that use it for synchronization (also known as 'clock consumers'). Nodes at which the clock signal is received for distribution directly to the clock consumers are referred to as leaf nodes.

In distributing a clock signal, it is important that its integrity be maintained. Jitter, an undesired deviation from true periodicity, is one factor that can adversely affect a clock signal. If left unchecked, jitter can cause erroneous operation of synchronous circuits and may even cause them to fail. Causes of jitter can include such factors as power supply noise, intrinsic device noise in the clock generator, and crosstalk with wires carrying other signals. Although it cannot be completely eliminated, it is possible to design circuits to tolerate a certain amount of jitter.

SUMMARY

A clock distribution network having a separate power supply for top levels thereof is disclosed. In one embodiment, an integrated circuit includes a clock distribution network configured to distribute a clock signal to each of a number of clock consumers (e.g., synchronous circuits such as flip-flops). The clock distribution network is arranged in a hierarchy of levels, with each of the levels including at least one buffer, and with the upper levels being closer to a source of the clock signal and the lower levels being closer to the clock consumers. The buffers of the upper levels are coupled to receive power from a first power source, via a first power grid. The buffers of the lower levels are coupled to receive power from a second power source, separate from the first, via a second power grid.

In one embodiment, the first power grid, used to distribute power to the buffers of the upper levels of the clock distribution network, is implemented at least in part on one of the upper metal layers of the integrated circuit. The power source used to provide power to the buffers of the upper levels of the clock distribution network may be implemented as a regulated power supply or a unregulated power supply, and may further be implemented on chip or off chip. The first power source may be a power supply/source, which is separate from a power source used to distribute power to logic circuits of the integrated circuit, including the clock consumers. Accordingly, the first power source and the power on the first power grid may be less susceptible to noise. This may in turn reduce the amount of jitter in the distributed clock signal.

BRIEF DESCRIPTION OF THE DRAWINGS

The following detailed description makes reference to the accompanying drawings, which are now briefly described.

Figure 1:
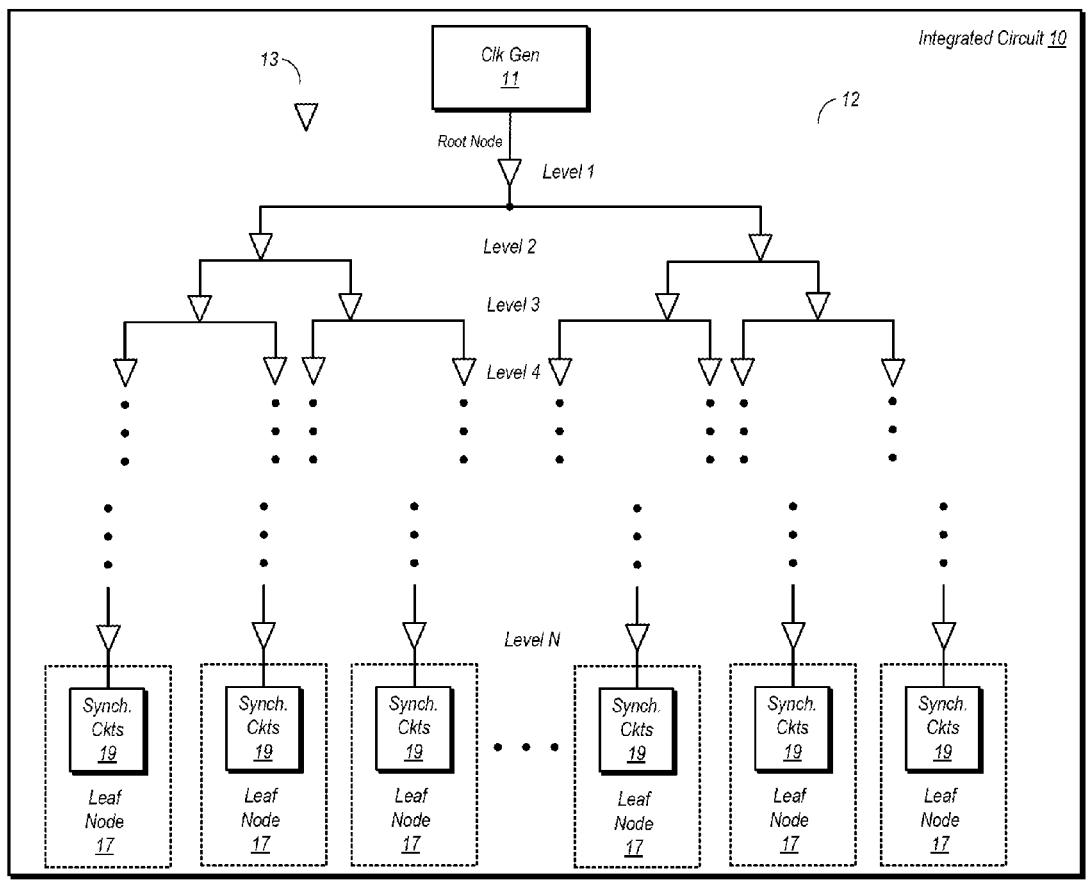
FIG. 1 is a block diagram of one embodiment of an integrated circuit including a clock distribution network.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

FIG. 1 is a block diagram of one embodiment of an integrated circuit including a clock distribution network. In the embodiment shown, integrated circuit (IC) 10 includes a clock generation circuit 11 that is configured to generate a clock signal for distribution to a number of different synchronous circuit 19. Clock generation circuit 11 may be one of a number of different types of clock generation circuits, such as an oscillator, a phase locked loop (PLL) or any other circuit capable of generating a clock signal. The synchronous circuits 19 may be any type of circuitry that utilizes one or more clock signals during operation. Such clock consumer circuits include, but are not limited to, flip-flops, timers, execution units, or any other sequential logic circuits. Each instance of synchronous circuits 19 shown in FIG. 1 may represent one or more circuits that utilize the clock signal. For example, a block of synchronous circuits 19 may represent a group of flip-flops, a single flip-flop, or one or more other types of sequential logic circuits. Furthermore, the circuits within a given block of synchronous circuits 19 need not be homogenous, and thus multiple types of sequential circuits may be present one of the blocks shown.

The clock signal generated by clock generation circuit 11 may be distributed to the synchronous circuits 19 via a clock distribution network, referred to here as clock tree 12. The output of clock generation circuit 11 represents a root node of clock tree 12. Each block of synchronous circuits 19 may be associated with a corresponding one of leaf nodes 17. Thus, the clock signal may be distributed through clock tree 12 from the root node to each of the leaf nodes.

Clock tree 12 is arranged in a number of different levels, levels 1–N in this example. The value N may be any integer value. Each level includes one or more buffers 13. In this particular embodiment, buffers 13 are non-inverting buffers. However, other embodiments that replace these buffers with inverters or other suitable circuitry (inverting non-inverting) are possible and contemplated.

Level 1 of clock tree 12 includes a single buffer 13 having an input coupled to the root node and an output coupled to two buffers 13 of level 2. In general, the number of buffers increases with successive levels of clock tree 12, although this is not necessarily the case for each level relative to its previous level. In one embodiment, the number of buffers 13 may double with successive level, starting with a first level having only one buffer 13 ($2^0$ buffers), and a final level having $2^{N-1}$ buffers. Thus, if a clock tree has 16 levels and the number of buffers 13 doubles with each successive level, the final level may include $2^{15}$ buffers 13. However, as previously noted, it is not necessary that the number of buffers increases in any type of regular pattern with successive levels, although generally, levels closer to the leaf nodes 17 will have more buffers than levels closer to the root node.

In various embodiments of a clock tree 12 discussed herein, buffers 13 in levels closer to the root node may be powered by a separate power source from that used to power the buffers 13 in levels closer to the leaf nodes 17. In general, a clock signal distributed through a clock tree may be subject to jitter due to power supply noise from various sources (e.g., simultaneous switching noise). Thus, a noisier power supply (or power distribution grid) may thus result in more jitter in a clock signal. However, by powering buffers 13 closer to the root node of clock tree 12 by a separate, quieter power source, jitter in the clock signal may be significantly reduced. The reduction of jitter may in turn yield various performance benefits, such as a higher maximum operating frequency for the IC. Furthermore, since power from the quieter power source is provided to buffers 13 of just a few levels that are closest to the root node in clock tree 12, the footprint of this separate power distribution network may be relatively small, if not negligible in size. For example, if the number of buffers 13 powered by the separate, quieter power source is in the range of, e.g., 16-32, the corresponding power grid may be extremely small relative to the power grid used to distribute power to the remaining buffers and the synchronous circuits 19 in the leaf nodes 17. Thus, with a minimal impact on IC area, a significant performance gain may be realized.

Figure 2:
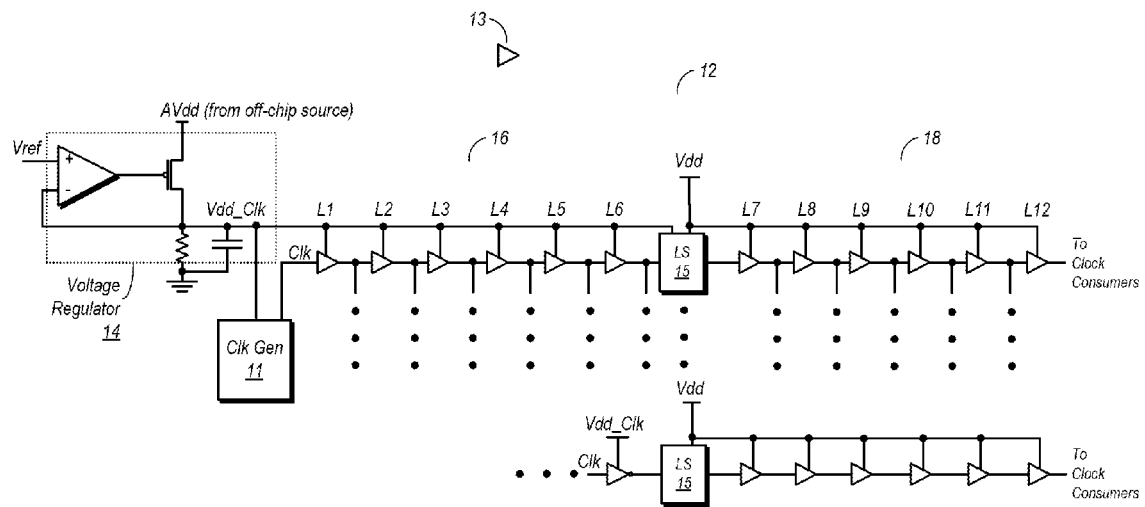
FIG. 2 is a diagram illustrating the distribution of power to one embodiment of a clock distribution network.

FIG. 2 is a diagram illustrating the distribution of power to one embodiment of a clock tree. In this particular embodiment, clock tree 12 includes 12 different levels. For the purposes of illustration, it is assumed that the number of buffers doubles with each successive level after Level 4, beginning with a single buffer at Level 1, although it is again noted that this example is not intended to limit the disclosure. Buffers 13 in Levels 1-6 are each coupled to receive power output from voltage regulator 14 on power grid 16, which is arranged to distribute Vdd_Clk. The clock signal is distributed into the clock tree from clock generation circuit 11, which is also coupled to receive Vdd_Clk.

Voltage regulator 14 in the embodiment shown is coupled to receive power from an off-chip power source configured to distribute the voltage AVdd (Analog Vdd). This is a relatively quiet power source used to power certain circuits on IC 10, but not used to power logic circuits (sequential or combinational). Accordingly, AVdd, and thus Vdd_Clk, is not significantly (if at all) subject to switching noise resulting from the switching of various logic circuits in IC 10. Since the number of buffers 13 doubles each level in this particular embodiment, power grid 16 thus distributes Vdd_Clk to 17 buffers total throughout levels 1-6. Additionally, voltage regulator 14 in the embodiment shown is coupled to receive a reference voltage, which may be generated by an on-chip or off-chip source.

Buffers 13 in levels 7-12 are each coupled to receive the voltage Vdd via power grid 18. Power grid 18 may receive voltage Vdd from a different source than AVdd which provides the power to generate Vdd_Clk. Voltage Vdd may also be distributed to other circuitry, such as the various synchronous circuits 19 of IC 10. Since the number of buffers 13 doubles each level in this particular embodiment, Vdd is distributed to 2048 buffers in level 12 alone.

Clock tree 12 in the embodiment shown includes a number of level shifters 15. Each level shifter 15 in this particular embodiment is coupled between the output of a Level 6 buffer and an input of a Level 7 buffer. The level shifters 15 each level shift the clock signal from the Vdd_Clk domain to the Vdd domain, and their respective voltages may be different. In prior art embodiments, a level shifter is typically coupled between an output of a clock generation circuit and an input of a buffer in the first level of the clock tree. However, for various embodiments of the clock tree as discussed herein, multiple level shifters are provided at a specified level of the clock tree in accordance with the boundary between Vdd_Clk and Vdd.

Figure 3:
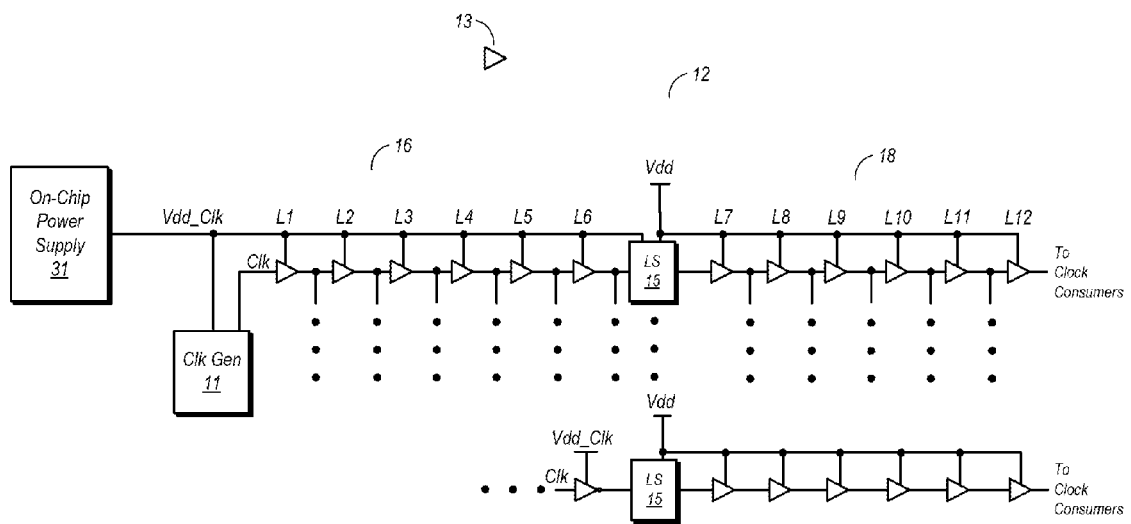
FIG. 3 is a diagram illustrating the distribution of power to another embodiment of a clock distribution network.

FIG. 3 is a diagram illustrating the distribution of power to another embodiment of a clock tree. The embodiment of clock tree 12 shown in FIG. 3 is largely similar to the embodiment shown in FIG. 2. However, instead of receiving power from a voltage regulator, clock tree 12 in FIG. 3 receives Vdd_Clk from an on-chip power supply 31. The on-chip power supply 31 may be unregulated in some embodiments. In particular, using an unregulated power supply may be possible in instances where Vdd_Clk is distributed to relatively few devices, such as the buffers 13 and clock generation circuit 11.

Figure 4:
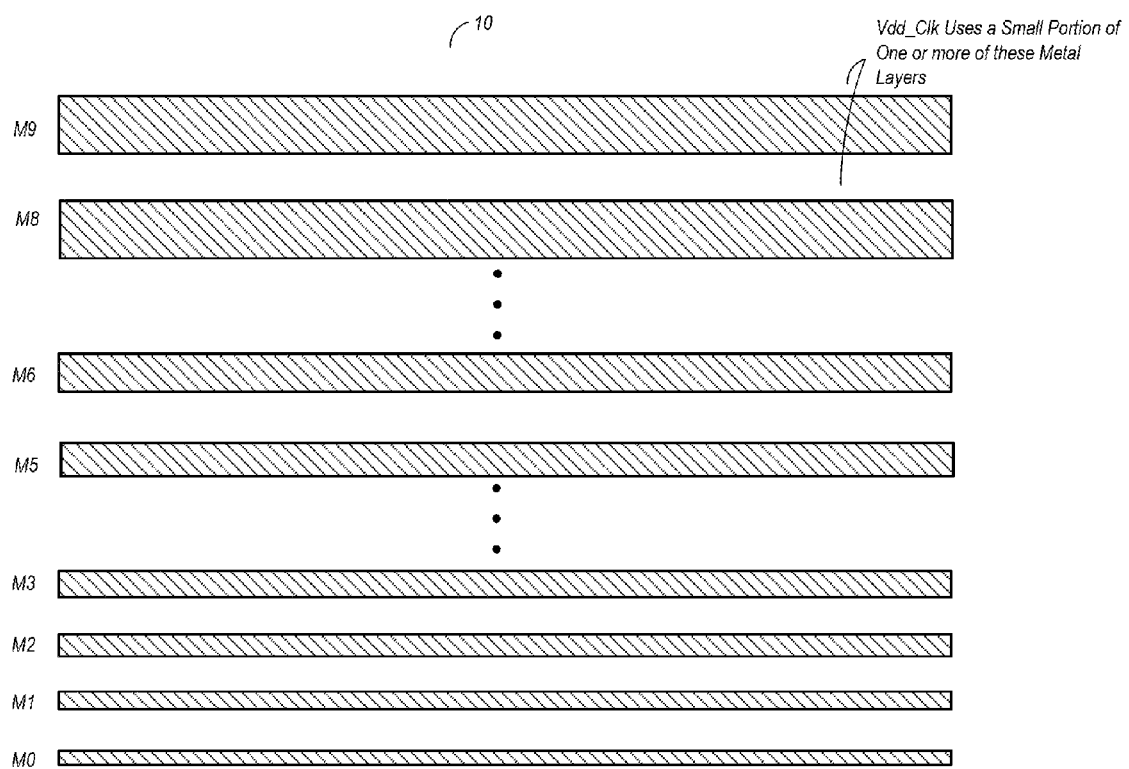
FIG. 4 is a diagram illustrating the arrangement of metal layers in one embodiment of an integrated circuit.

The power distribution grid 16 used to provide power to a subset of the levels of the clock tree closest to the root node may utilize a portion of one or more upper metal layers of an IC die. FIG. 4 is a diagram illustrating the arrangement of metal layers in one embodiment of an IC. In the embodiment shown, one or more of the upper metal layers are used to provide a distribution path for Vdd_Clk. In this particular example, M9 and M8 (Metal 9 and Metal 8) are the upper two layers of IC 10. The primary wires for distributing power in power grid 16 may be implemented on at least one of these layers. In some cases, a both layers, along with vias (not shown), may be used to avoid conflicts with other wires that utilize one or more of these metal layers. Additionally, vias are present (but not shown here) to convey power from the upper metl layer(s) down to the transistors that make up the buffers 13. By utilizing relatively thick, low resistance wires in the upper metal layers, noise may be further minimized in the power distribution grid.

Figure 5:
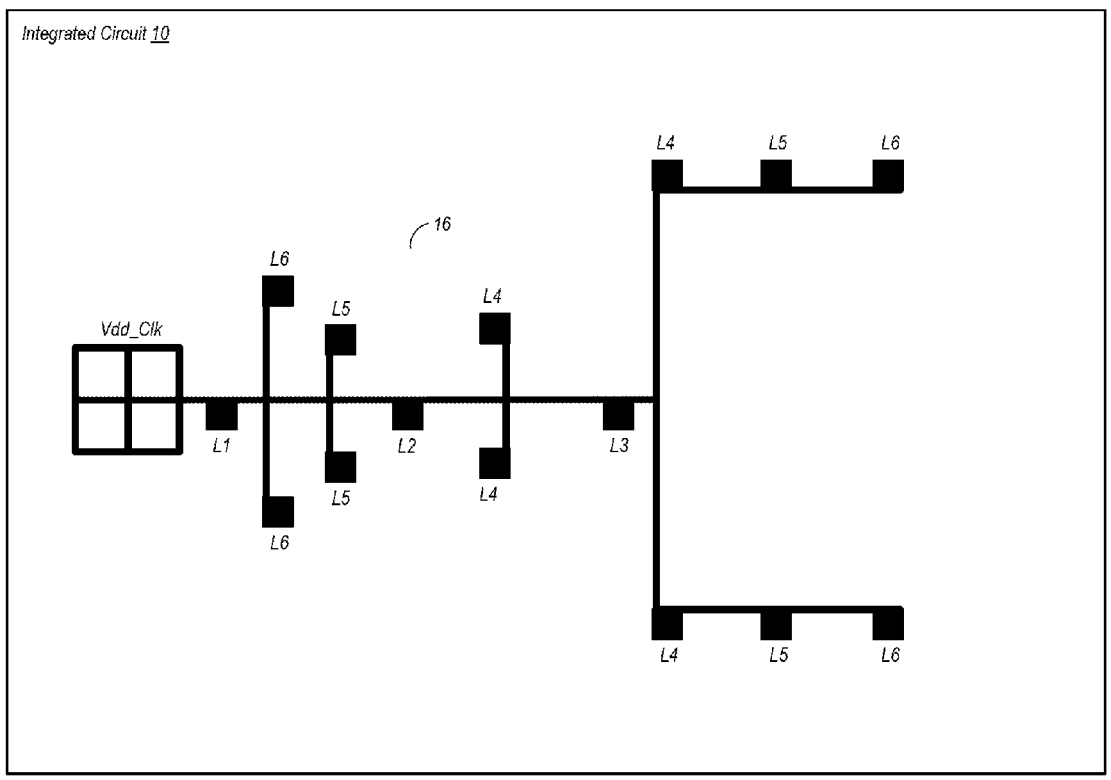
FIG. 5 is a top view of one embodiment of an integrated circuit illustrating a power distribution to the upper levels of its clock distribution network.

FIG. 5 is a top view of one embodiment of an IC illustrating a power distribution to the upper levels of its clock distribution network. In the embodiment shown, a layout of one embodiment of a power grid 16 is shown. Power may be distributed from the area labeled Vdd_Clk (which is close to the source of that voltage), through the wires shown to the various levels of the clock tree that receive that voltage. The points of distribution to a particular level are labeled as such, e.g., L1 is a point of distribution of power to Level 1, L2 is a point of distribution of power to Level 2, and so on. At these points, vias from the metal layer may extend downward through the die to the transistors of the buffers 13 which receive Vdd_Clk. It is noted that the size of the features shown here are exaggerated for illustrative purposes. In practice, the feature sizes may be smaller relative to the overall size of the IC die.

Figure 6:
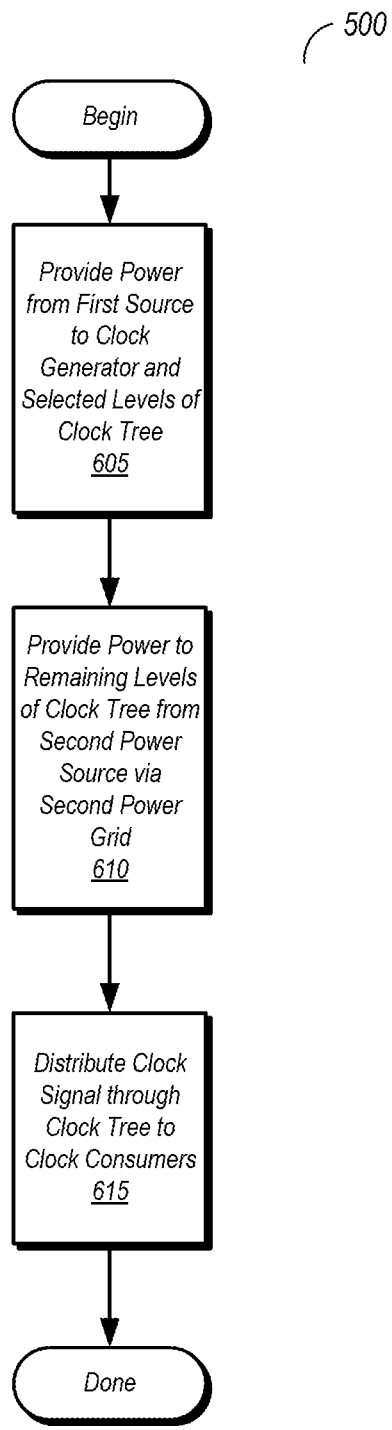
FIG. 6 is a flow diagram of one embodiment of a method for distributing power to a clock distribution network.

FIG. 6 is a flow diagram of one embodiment of a method for distributing power to a clock distribution network. It is noted that method 600 may be performed using the various embodiments of an IC discussed above, as well as IC embodiments not explicitly discussed herein. In general, method 600 may be applicable to any IC that includes a clock distribution network.

Method 600 begins with the provision of power from a first source, via first power grid, to a clock generator and buffers of selected levels of a clock tree (block 605). The selected levels are a contiguous group of levels that are closest to the root node of the clock tree (i.e. the point at which the clock is provided from the clock generator). For example, if a clock tree has sixteen levels, the power from the first power source may be distributed to buffers of, e.g., the first six levels. The first power source may be on-chip or off-chip, and further, may be regulator or unregulated. In general, a quiet power supply that distributes power to relatively few components may be used such that the effect of noise-induced jitter on the clock signal is minimized.

Method 600 further includes providing power to buffers of the remaining levels of the clock tree, from a second power source and via a second power grid (block 610). The remaining levels of the clock tree also form a contiguous group of levels that continue to the leaf nodes of the clock tree. The second power source is different from the first, and may be used to provide power to not only the buffers of the remaining clock tree levels, but to other circuits, including clock consumers. The method further includes distributing the clock signal through the clock tree to the clock consumers of the IC (block 615).

Figure 7:
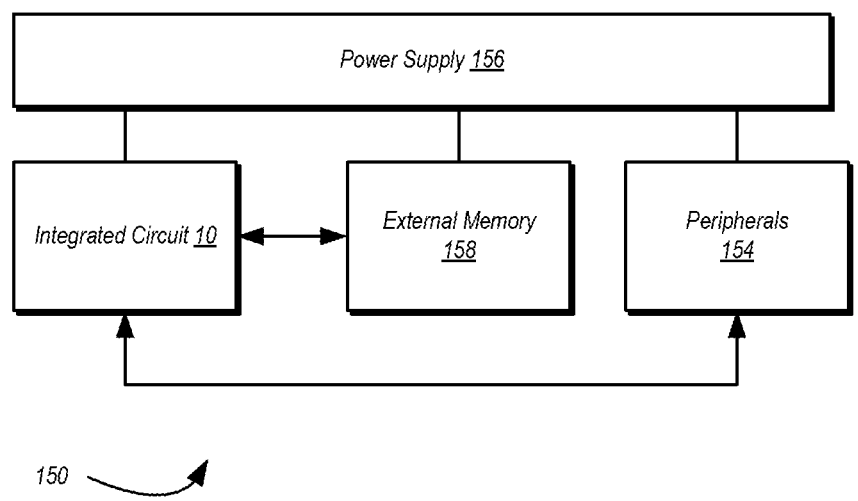
FIG. 7 is a block diagram of one embodiment of an exemplary system.

Turning next to FIG. 7, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a clock source configured to generate a clock signal;
a clock distribution network configured to distribute the clock signal, wherein the clock distribution network includes a plurality of levels divided into a first subset and a second subset, wherein each of the plurality of levels includes one or more buffers, wherein each of the buffers of the first subset is coupled to receive power exclusively from a first power source via a first power grid and wherein each of the buffers of the second subset is coupled to receive power exclusively from a second power source via a second power grid, the first power source and first power grid each being separate and distinct from the second power source and the second power grid, wherein a number of buffers in the second subset is greater than a number of buffers in the first subset; and
a plurality of logic circuits, the plurality of logic circuits each including a plurality of clock consumers coupled to receive the clock signal from buffers of the second subset, wherein the second power source is configured to provide power for the plurality of logic circuits and each of the buffers of the second subset, and wherein the first power source is implemented on the integrated circuit as an on-die voltage regulator configured to receive power from an off-die analog power supply not configured to provide power to any of the plurality of logic circuits.

2. The integrated circuit as recited in claim 1, wherein the levels of the first subset are contiguous, and wherein the levels of the second subset are contiguous.

3. The integrated circuit as recited in claim 2, wherein a buffer of a first level of the first subset is coupled to receive the clock signal directly from the clock source, and wherein buffers of a last level of the second subset are each coupled to distribute the clock signal to one or more of the plurality of clock consumers.

4. The integrated circuit as recited in claim 1, further comprising a plurality of level shifter circuits coupled between respective outputs of buffers of a last level of the first subset and respective inputs of buffers of a first level of the second subset.

5. The integrated circuit as recited in claim 4, wherein each of the first plurality of level shifters are coupled to receive the clock signal referenced to a voltage on the first power grid and are configured to output the clock signal referenced to a voltage on the second power grid.

6. The integrated circuit as recited in claim 1, wherein at least a portion of the first power grid is implemented on an uppermost metal layer of the integrated circuit.

7. The integrated circuit as recited in claim 1, wherein the clock source is configured to receive power via the first power grid.

8. The integrated circuit as recited in claim 1, wherein a number of buffers in each successive one of the plurality of levels is greater than a number of buffers of a previous one of the plurality of levels.

9. The integrated circuit as recited in claim 8, wherein the number of buffers in each successive one of the plurality of levels is double the number of buffers in the previous one of the plurality of levels.

10. A method comprising:
generating a clock signal using a clock source implemented on an integrated circuit;
distributing the clock signal to a plurality of clock consumers of the integrated circuit through a clock distribution network, the clock distribution network having a plurality of levels divided into a first subset and a second subset, wherein each of the plurality of levels includes one or more buffers, and wherein a number of buffers in the second subset is greater than a number of buffers in the first subset;
providing power to the buffers of the first subset exclusively from a first power source via a first power grid;
providing power to the buffers of the second subset exclusively from a second power source via a second power grid, the first power source and first power grid being separate and distinct from the second power source and the second power grid;
the second power source providing power for a plurality of logic circuits included in the integrated circuit and each of the buffers of the second subset; and
the first power source providing power only to circuits coupled to receive power from the first power grid, the first power source being implemented as an on-die voltage regulator that receives power from an off-die analog power supply that does not provide power to any of the plurality of logic circuits.

11. The method as recited in claim 10, further comprising:
providing the clock signal from the clock source directly to at least one buffer in a highest level of the first subset of the plurality of levels, wherein the levels of the first subset are contiguous; and
providing the clock signal from buffers of a lowest level of the second subset directly to respectively coupled ones of the plurality of clock consumers, wherein the levels of the second subset are contiguous.

12. The method as recited in claim 10, further comprising level shifting the clock signal between an output of each buffer in a lowest level of the first subset and respectively coupled inputs of each buffer in a highest level of the second subset.

13. The method as recited in claim 10, wherein the clock source is configured to receive power via the first power grid.

14. An integrated circuit comprising:
a plurality of logic circuits including a plurality of synchronous circuits;
a clock source configured to generate a clock signal;
a clock distribution network configured to distribute the clock signal to the plurality of synchronous circuits, wherein the clock distribution network includes a first plurality of buffers arranged into a first plurality of levels and a second plurality of buffers arranged into a second plurality of levels, wherein at least one buffer of the first plurality of buffers is coupled to receive the clock signal directly from the clock source, and wherein each of a subset of the second plurality of buffers are coupled to provide the clock signal to one or more of the plurality of synchronous circuits, and wherein a number of buffers in the second subset is greater than a number of buffers in the first subset;
a first power source, wherein each of the first plurality of buffers is coupled to receive power exclusively from the first power source; and
a second power source, wherein each of the second plurality of buffers is coupled to receive power exclusively from the second power source, the second power source being separate and distinct from the first power source;
wherein the first power source is implemented on the integrated circuit as an on-die voltage regulator configured to receive power from an off-die analog power supply that is not configured to provide power to any of the plurality of logic circuits.

15. The integrated circuit as recited in claim 14, wherein the first plurality of levels are arranged in a first contiguous group, and wherein the second plurality of levels are arranged in a second contiguous group, wherein each level of the first plurality of levels is higher in a hierarchy of the clock distribution network than any of the second plurality of levels.

16. The integrated circuit as recited in claim 14 further comprising a first power grid, wherein the first power source is configured to distribute power to each of the first plurality of buffers via the first power grid, wherein the first power grid is implemented at least in part on an uppermost metal layer of the integrated circuit.

* * * * *